United States Patent [19]

Matsumoto et al.

[11] Patent Number: 5,098,649

[45] Date of Patent: Mar. 24, 1992

[54] RARE EARTH METAL-IRON GROUP METAL TARGET, ALLOY POWDER THEREFOR AND METHOD OF PRODUCING SAME

[75] Inventors: Shunichiro Matsumoto, Yasugi; Tsutomu Inui; Rokuo Ichiyasu, both of Yonago; Yoshitaka Chiba, Gyoda, all of Japan

[73] Assignee: Hitachi Metals, Ltd., Tokyo, Japan

[21] Appl. No.: 543,376

[22] Filed: Jun. 26, 1990

Related U.S. Application Data

[62] Division of Ser. No. 183,993, Apr. 20, 1988, Pat. No. 4,957,549.

[30] Foreign Application Priority Data

Apr. 20, 1987 [JP] Japan .................. 62-97057

[51] Int. Cl.$^5$ .................. B22F 1/00
[52] U.S. Cl. .................. 419/48; 419/57; 419/60; 419/33
[58] Field of Search .................. 419/33, 48, 57, 60

[56] References Cited

U.S. PATENT DOCUMENTS

| | | | |
|---|---|---|---|
| 3,928,089 | 12/1975 | Cech | 148/105 |
| 4,620,872 | 11/1986 | Hijikata et al. | 75/246 |
| 4,824,481 | 4/1989 | Chatterjee et al. | 419/33 X |
| 4,957,549 | 9/1990 | Matsumoto et al. | 419/33 X |
| 4,992,095 | 2/1991 | Nate et al. | 75/246 |

FOREIGN PATENT DOCUMENTS 59-162250 9/1984 Japan .
60-230903 11/1985 Japan .
61-91336 5/1986 Japan .
61-95788 5/1986 Japan .
61-99640 5/1986 Japan .
61-119648 6/1986 Japan .
61-139637 6/1986 Japan .
62-70550 4/1987 Japan .
62-274033 11/1987 Japan .
63-50469 3/1988 Japan .

OTHER PUBLICATIONS

"Mikkei New Materials", p. 61, Nov. 24, 1988.
Summary of lectures in 10th Academic Meeting of Japan Applied Magnetics Association, pp. 128-129, 1986.

Primary Examiner—Brooks H. Hunt
Assistant Examiner—Leon Nigohosian, Jr.

[57] ABSTRACT

A rare earth metal-iron group metal target for a magneto-optical disk is produced by mixing power (a) produced by the rapid quenching treatment of an alloy composed of at least one rare earth metal and at least one iron group metal in a composition range which permits the formation of an eutectic structure, with powder (b) from at least one iron group metal in an amount necessary for meeting the composition requirements of the target; and subjecting the resulting mixture to pressure sintering in vacuum or in an inert gas atmosphere at a temperature lower than a liquid phase-appearing temperature of the mixture to produce a rare earth metal-iron group metal intermetallic bonding layer betwen the particles.

3 Claims, 7 Drawing Sheets (×100)

(×200)

(×1000)

Dy

Fe-Dy EUTECTIC ALLOY PHASE

Fe

Co

Fe-Dy EUTECTIC ALLOY PHASE

Fe

Fe₂Dy DIFFUSION BONDING LAYER

Fe

Co (X490)

(× 400)

RARE EARTH METAL-IRON GROUP METAL TARGET, ALLOY POWDER THEREFOR AND METHOD OF PRODUCING SAME

This is a division of application Ser. No. 07/183,993, filed Apr. 20, 1988, now U.S. Pat. No. 4,957,549.

BACKGROUND OF THE INVENTION

The present invention relates to alloy powder for rare earth metal-iron group metal targets for magneto-optical recording media, a rare earth metal-iron group metal target and methods of producing them.

Recently, vigorous development has been conducted to provide a magneto-optical disk, which is a rewritable, high-density recording medium, formed by sputtering a thin layer composed of rare earth metals and iron group metals in a desired composition on a glass or plastic disk substrate. Targets used in the sputtering are conventionally produced by various methods as follows:

(1) Melting a rare earth metal-iron group metal alloy having a desired composition in vacuum or in an inert gas atmosphere and then casting it into a desired shape similarly in vacuum or in an inert gas atmosphere to provide a target ("Nikkei New Material," p. 61, Nov. 24, 1986);

(2) Melting and casting an alloy having a desired composition in vacuum or in an inert gas atmosphere into an ingot, and pulverizing it into powder which is then sintered under pressure (Japanese Patent Laid-Open No. 61-91336);

(3) Mixing rare earth metal powder with iron group metal powder in a desired proportion, and sintering the mixed powder under pressure at a temperature lower than a liquid phase-appearing temperature (Japanese Patent Laid-Open No. 61-99640); and (4) Preparing iron group metal-rare earth metal alloy powder containing the iron group metal in an amount smaller than the desired value by melting and pulverizing, mixing the above alloy powder with iron group metal powder in a desired composition, pressing the powder mixture into a desired shape and then sintering it (Japanese Patent Laid-Open No. 60-230903).

However, all of the above methods suffer from various problems. Specifically, when a target is produced by the method (1), the following problems take place:

(a) Additive elements are likely to be segregated in the casting operation, making it difficult to provide a homogeneous target.

(b) Since extremely brittle intermetallic compounds are formed in the rare earth metal-iron group metal alloy, it is difficult to utilize a structure-homogenizing process such as forging. Therefore, it is impossible to eliminate defects such as holes or voids formed in the casting process.

(c) Since it is brittle, chipping and cracking are highly likely to take place in the formation of a target, meaning that mechanial working is extremely difficult. In addition, thermal stress applied in a bonding or sputtering operation tends to cause cracking of the target.

(d) When a target produced by method (1) is used for sputtering to form a thin layer for a magneto-optical disk, the thin layer tends to have a composition which is richer in an iron group metal by nearly 7-10 atomic % than the desired composition, making it difficult to control the composition of the resulting thin film.

When a target is produced according to method (2) a homogeneous target can be obtained, but the same problems as those of targets produced by the above method (1) exist because alloy particles per se are composed of brittle intermetallic compounds.

With respect to the method (3), the following problems exist:

(a) Since rare earth metals have a strong affinity for oxygen, they are likely to be oxidized in the course of pulverization, powder handling and pressure sintering, making it difficult to provide low-oxygen sintered bodies. If a target produced by this method is used for sputtering, the oxygen contained in the target material is introduced into the resulting thin film, thereby selectively oxidizing the rare earth metals and so deteriorating the magnetic properties of the thin film, particularly the coercive force Hc thereof.

(b) In the early stage of sputtering, a rare earth metal phase portion is more preferentially sputtered than an iron group metal phase portion, and only in the later stage is equilibrium achieved in a sputtering rate between the iron group metal phase and the rare earth metal phase. Accordingly, presputtering for a long period of time is needed until the composition of the thin layer being formed becomes stable, making the preparation of the target less efficient.

Last, when the above method (4) is used, specifically when iron group metal-rare earth metal alloy powder is mixed with about 1-10 weight % of an iron group metal to provide a powder mixture having a desired composition which is then pressed and sintered, as shown in Example of Japanese Patent Laid-Open No. 60-230903, the following problems take place:

(a) Although the time necessary for presputtering until the composition of the thin layer being formed becomes stable is shorter than in the case of a target produced by the above method (3), a large difference in composition exists between the target desired and the thin layer formed and also the thin layer suffers from large unevenness of composition in the plane thereof.

(b) A target with high density cannot be obtained merely by pressing a powder mixture and sintering the resulting green body in an inert gas or in vacuum; a target thus produced has voids which cause abnormal discharge in the process of sputtering.

(c) With respect to machinability, the target produced by the method (4) is relatively improved compared to those produced by the methods (1) and (2), but substantially all rare earth metals contained in the material are formed into intermetallic compounds with iron group metals, so that cracking and chipping are highly likely to take place in the process of mechanical working, for instance, by a lathe.

Japanese Patent Laid-Open No. 62-70550 discloses a target substantially free from all problems inherent to the above-mentioned conventional technologies, and has a fine mixed structure in which intermetallic compounds of rare earth metals and iron group metals are bonded with iron group metals by sintering. More specifically, this target having the above structure is obtained by mixing rare earth metal powder with iron group metal powder in a desired proportion, subjecting the resulting mixture to pressure sintering at a temperature lower than a liquid phase-appearing temperature to form a sintered body composed of rare earth metals and iron group metals, and then heating it at a temperature equal to or higher than the liquid phase-appearing temperature for a short period of time to convert the rare earth metals in the sintered body into intermetallic compounds.

With this target, the rare earth metals take a shorter time to sputter when they are converted into metallic compounds than when they are not chemically bonded, and so their sputtering rate becomes closer to that of the iron group metals. As a result, the problem of unstableness in compostion of a sputtered thin layer which has been pointed out conventionally can be solved, and the target has strength which sufficiently ensures mechanical workability due to the iron group metals contained therein.

It has been found through investigations by the inventors, however, that the technology of Japanese Patent Laid-Open No. 62-70550 still suffers from the following problems:

(a) It is reported by "Summary of Lectures in 10th Academic Meeting of Japan Applied Magnetics Association," pp. 128-129, 1986 that the difference in composition between a target used and a thin layer being formed can be eliminated by properly adjusting the the proportions of rare earth metals, iron group metals and rare earth metal-iron group metal intermetallic compounds. Nevertheless, with a target whose structure is controlled by a heat treatment as in Japanese Patent Laid-Open No. 62-70550, the following problems occur:

(i) Intermetallic compounds around the iron group metals grow abnormally during the heat treatment;

(ii) There is a eutectic alloy phase composed of an $\alpha$-phase of rare earth metals and a rare earth metal-iron group metal intermetallic compound phase in addition to an iron group metal phase and an intermetallic compound phase as shown in FIG. 6C of Japanese Patent Laid-Open No. 62-70550, but it is extremely difficult to control the amounts of the $\alpha$-phase of rare earth metals and the rare earth metal-iron group metal intermetallic compounds precipitated in this eutectic alloy phase; and (iii) Unevenness in structure is likely to appear.

Therefore, the sputtering with the above target causes the following problems;

(i) If extended sputtering is required, unevenness in the composition and characteristics of the thin layer formed tends to appear; and (ii) Even with the same target composition, the thin layer composition and characteristics vary from one heat treatment lot to another, meaning that there is large non-uniformity among lots.

(b) From the aspect of mechanical strength, brittle rare earth metal-iron group metal intermetallic compounds existing around the iron group metals should be as thin as possible, but they undesirably tend to become thick by abnormal growth as mentioned above.

(c) A target produced by sintering a mixture of rare earth metal powder and iron group metal powder inherently tends to have a high oxygen content, and also due to heat treatment the final product is further likely to have a high oxygen content, deteriorating the characteristics of the thin layer formed therefrom.

(d) A sintered body is liable to warping and bending in the course of cooling from a heat treatment temperature to room temperature.

OBJECT AND SUMMARY OF THE INVENTION

Therefore, an object of the present invention is to provide rare earth metal-iron group metal target alloy powder free from the above problems inherent to the conventional technologies and enabling stable sputtering.

Another object of the present invention is to provide a rare earth metal-iron group metal target having good sputtering properties and sufficient mechanical strength without suffering from the above problems.

A further object of the present invention is to provide a method of producing such a target.

A still further object of the present invention is to provide a method of producing such alloy powder.

As a result of intense research in view of the above objects, the inventors have found that such a target free from the above problems can be obtained by conducting a rapid quenching treatment such as a gas atomizing method to prepare rare earth metal-iron group metal alloy powder in which an $\alpha$-phase of rare earth metals and intermetallic compounds are uniformly and finely precipitated, and iron group metal powder, and subjecting their mixture to pressure sintering at a temperature lower than a liquid phase-appearing temperature. The present invention is based on this finding.

Thus, the rare earth metal-iron group metal target according to the present invention has a structure in which a eutectic alloy phase composed of the rare earth metal and the iron group metal and an iron group metal phase are bonded with each other via a diffusion bonding layer consisting essentially of a rare earth metal-iron group metal intermetallic compound.

The alloy powder for a rare earth metal-iron group metal target according to the present invention has a structure in which an $\alpha$-phase of the rare earth metal and an intermetallic compound phase composed of the rare earth metal and the iron group metal are uniformly and finely dispersed.

The method of producing a rare earth metal-iron group metal target according to the present invention comprises the steps of mixing powder produced by the rapid quenching treatment of an alloy composed of at least one rare earth metal and at least one iron group metal in a composition range which permits the formation of an eutectic structure, with the powder of at least one iron group metal in an amount necessary for meeting the composition requirements of the target; and subjecting the resulting mixture to pressure sintering in vacuum or in an inert gas atmosphere at a temperature lower than the liquid phase-appearing temperature of the mixture.

The method of producing alloy powder for a rare earth metal-iron group metal target according to the present invention comprises subjecting an alloy melt composed of at least one rare earth metal and at least one iron group metal in a composition range which permits the formation of a eutectic structure to a rapid quenching treatment.

BRIEF DESCRIPTION OF THE DRAWINGS

FIGS. 2(a)-(d) are photomicrographs by an electron probe microanalyzer(EPMA) showing the microstructure of an Fe-Co-Dy target according to another embodiment of the present invention at a magnification of ×490, in which FIG. 2(a) shows a distribution of a rare earth element (Dy), FIG. 2(b) a secondary electron image of the microstructure, FIG. 2(c) a diffusion bonding layer between an Fe-Dy eutectic alloy phase and an Fe phase, and FIG. 2(d) a Co phase;

DETAILED DESCRIPTION OF THE INVENTION

Figure 1A:
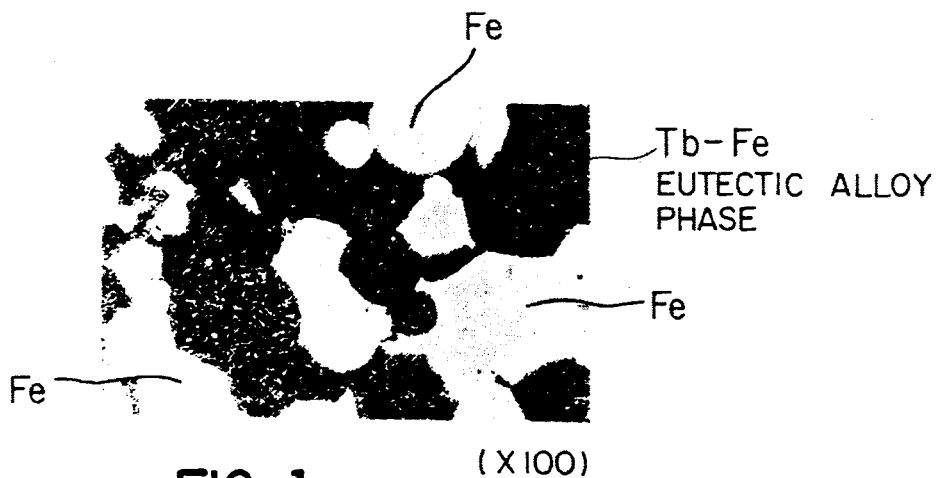
FIGS. 1(a)-(c) are photomicrographs showing the micro-structure of a target according to one embodiment of the present invention at various magnifications ($\times 100$, $\times 200$ and $\times 1000$, respectively)
Figure 1B:
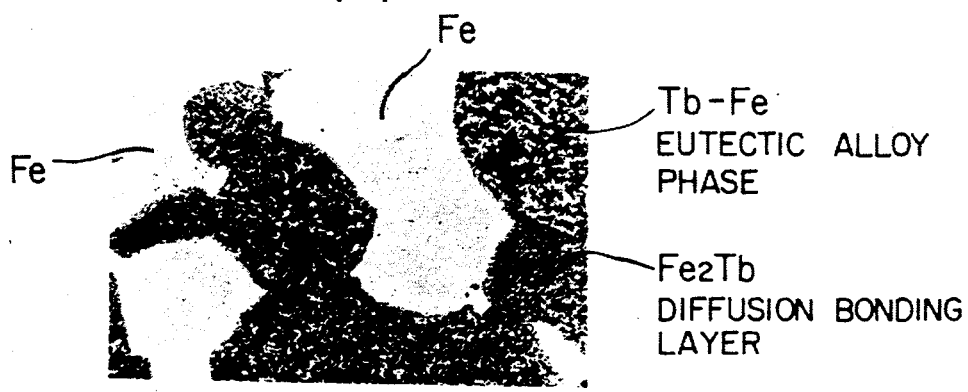
Figure 1C:
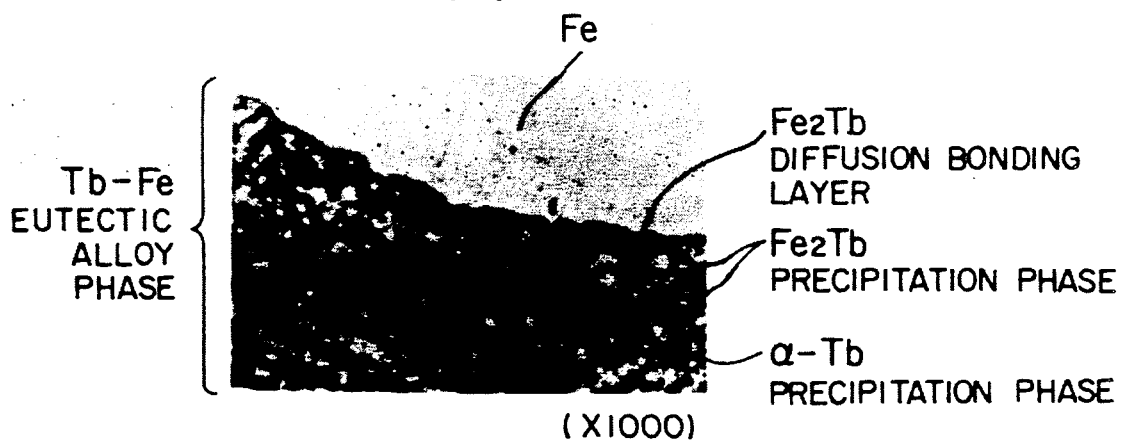
Figure 2A:
Figure 2B:
Figure 2C:
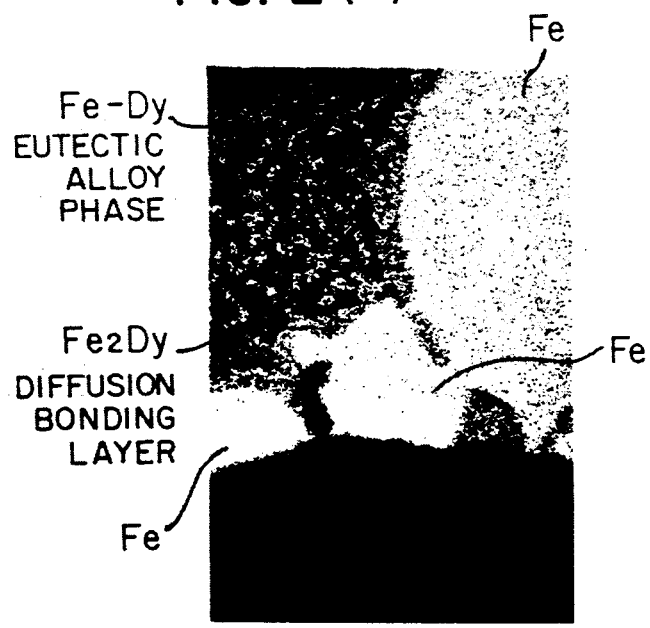
Figure 2D:
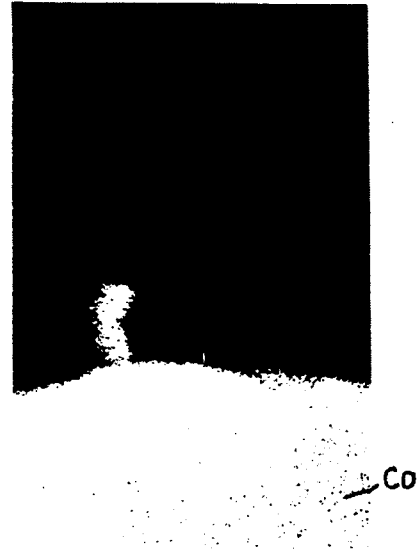

The present invention will be explained in detail. FIGS. 1(a), (b) and (c) show the microstructures of the target of the present invention. Their magnifications are ×100 for FIG. 1(a), ×200 for FIG. 1(b) and ×1000 for FIG. 1(c). Their elctron probe microanalysis (EPMA) has confirmed that an iron group metal phase such as Fe phase and a rare earth metal-iron group metal eutectic alloy phase are bonded with each other via a solid phase diffusion bonding layer consisting essentially of an inter metallic compound of the rare earth metal and the iron group metal.

The characteristics of the structure of the target of the present invention will be explained referring to FIG. 1.

The first characteristic is that an Tb-Fe eutectic alloy phase is composed of an $Fe_2Tb$ precipitation phase and an $\alpha$-Tb precipitation phase both extremely uniformly and finely dispersed. This is due to the fact that alloy powder produced by a rapid quenching treatment such as an atomizing method and structure in which an $\alpha$-Tb precipitation phase and an $Fe_2Tb$ precipitation phase are uniformly and finely precipitated is used as a starting material, and that pressure sintering is conducted at a temperature lower than a liquid phase-appearing temperature to retain this structure.

According to the present invention, the distance between the adjacent precipitation phases of the same type (both $\alpha$-Tb or both $Fe_2Tb$ ) is 5 $\mu m$ or less on average in a uniform dispersion state.

Because the target of the present invention has the above uniform fine structure, the difference in composition between the target used and the thin film produced therefrom by sputtering can be extremely reduced, thereby decreasing the time of presputtering conducted before the sputtering.

According to the article in Summary of Lectures held in 10th Academic Meeting of Japan Magnetics Association (p. 128, 1986), when a composite target, namely a target composed of a rare earth metal and an iron group metal is used for sputtering, the iron group metal is more inclined to be sputtered at the target periphery side than the rare earth metal, resulting in a thin layer composition poor in the iron group metal. On the other hand, in a case of the target composed of intermetallic compounds, the rare earth metal is more inclined to be sputtered at the target periphery than the iron group metal, resulting in a thin layer composition rich in the iron group metal. On the contrary, in the target of the present invention, a eutectic alloy phase composed of an $\alpha$-phase of a rare earth metal and a rare earth metal-iron group metal intermetallic compound, a solid phase bonding layer and an iron group metal phase are uniformly and finely dispersed, so that the difference in a sputtering direction between rare earth metal particles and the iron group metal particles is reduced, resulting in a small composition unevenness.

The reasons for decreasing the presputtering time are considered as follows: (1) Compared with the difference in sputtering rate between iron group metals and rare earth metals as shown in Japanese Patent Laid-Open No. 62-70550, the difference in the sputtering rate between the iron group metals and rare earth metal-iron group metal intermetallic compounds is smaller: and (2) Rare earth metal-iron group metal alloy powder is produced by rapid quenching, the $\alpha$-phase of rare earth metal and the intermetallic compound phase are uniformly and finely dispersed: in other words, the rare earth metal phase are finely precipitated, and so the sputtering rate of the $\alpha$-phase of rare earth metal is increased as a whole nearly to the level of the intermetallic compound phase, despite the fact that the sputtering rate of rare earth metal does not change microscopically.

The second characteristic of the structure of the target of the present invention is that it has an extremely thin diffusion bonding layer consisting essentially of the rare earth metal-iron group metal intermetallic compound. This is due to the fact that the bonding layer is a solid phase diffusion bonding layer formed by pressure sintering at a temperature lower than a liquid phase appearing temperature.

Since the diffusion bonding layer is thin, providing the structure with substantially no unevenness, stable thin layer characteristics can be obtained even with a long sputtering time, without suffering from the deterioration of mechanical strength.

According to the present invention, this bonding layer can be adjusted to be as thin as 10 $\mu m$ or less, but from the aspect of mechanical strength, it is desirably adjusted to 30 $\mu m$ or less.

The rare earth metals which will be used in the target of the present invention include at least one of Tb, Gd, Dy, Nd, Sm, Ho, Tm, etc. When the content of the rare earth metal is lower than 15 atomic % or exceeds 45 atomic %, it is difficult to provide a thin layer capable of functioning as a magneto-optical recording medium, so that it should be in the range of 15-45 atomic %.

With respect to the iron group metals, they are at least one of Fe, Co and Ni.

Thus, the intermetallic compounds mentioned herein include not only $Fe_2Tb$, for instance, but also intermetallic compounds of various types of iron group metals and rare earth metals such as FeCoTb.

When the alloy is used as a recording medium, its life as a medium and particularly its corrosion resistance are important together with its magnetic properties. However, since the rare earth metal has a strong affinity to oxygen, it is selectively oxidized by water permeating into the target through a substrate and a protective layer during its use as a recording medium for a long period of time, resulting in the deterioration of the magnetic properties thereof.

Effective against this problem is to add Ti, Al, Cu, Cr, Nb, Ta, Pd or Pt to the target. Thus an additional characteristic of the present invention is that the target may contain at least one element selected from the group consisting of Ti, Al, Cu, Cr, Nb, Ta, Pb and Pt. Incidentally, since excess addition of one or more of the above elements adversely affects the magnetic properties of the resulting thin film, it should be 15 atomic % or less based on the total amount of the target.

FIG. 2 shows the microstructure of an Fe-Co-Dy target according to another embodiment of the present invention. It has been confirmed that it has a structure in which an iron group metal phase consisting of Fe and Co and a eutectic alloy phase consisting of and Fe-Dy intermetallic compound an $\alpha$-Dy are bonded with each other via a diffusion bonding layer consisting essentially of an Fe-Dy intermetallic compound.

Next, the methods of producing the target of the present invention and alloy powder therefor will be explained.

In the present invention, first, rare earth alloy-iron group metal alloy powder and iron group metal powder are prepared. One of the characteristics of the present invention is that the rare earth metal-iron group metal alloy powder is produced by a rapid quenching treatment, and that this rapid quenching treatment enables the resulting alloy powder to have an $\alpha$-phase of the rare earth metal and the intermetallic compound phase which are uniform and finely dispersed on the powder level that is, within each particle. Accordingly, from the aspect of composition, it is necessary that the composition of the rare earth metal and the iron group metal is within the composition range which enables the formation of a eutectic structure.

The rare earth metal-iron group metal alloy powder can be obtained by melting starting materials and then conducting a rapid quenching treatment thereof, and the starting materials to be melted desirably consist essentially of a low-oxygen rare earth metal-iron group metal eutectic alloy.

Specifically speaking, although it is possible to use as starting materials to be melted pure rare earth metal and iron group metal in a predetermined proportion, "pure" rare earth metal has a high oxygen content; for instance commercially available high-purity Tb contains 900–1200 ppm of oxygen. And the materials cannot be melted completely without heating at high temperature for a long time, so that the resulting rare earth metal iron group metal alloy powder inevitably has an increased oxygen content, for instance, 2200 ppm for Tb-Fe alloy powder.

On the contrary, a rare earth metal-iron group metal eutectic alloy produced by a fused salt electrolysis method, etc. has as low an oxygen content as 100–500 ppm, and the melting temperature is relatively low. Accordingly, it is possible to decrease the melting time and so to reduce the oxygen content.

Applicable as a rapid quenching method are an inert gas atomizing method, a vacuum atomizing method, a roll quenching method, etc. which use an alloy melt, and a rotating electrode method using an electrode in the range of the above composition range. In a water-cooled roll quenching method and a rotating electrode method, etc, the atmosphere should be vacuum or an inert gas to prevent the oxidation of the alloy.

Figure 3:
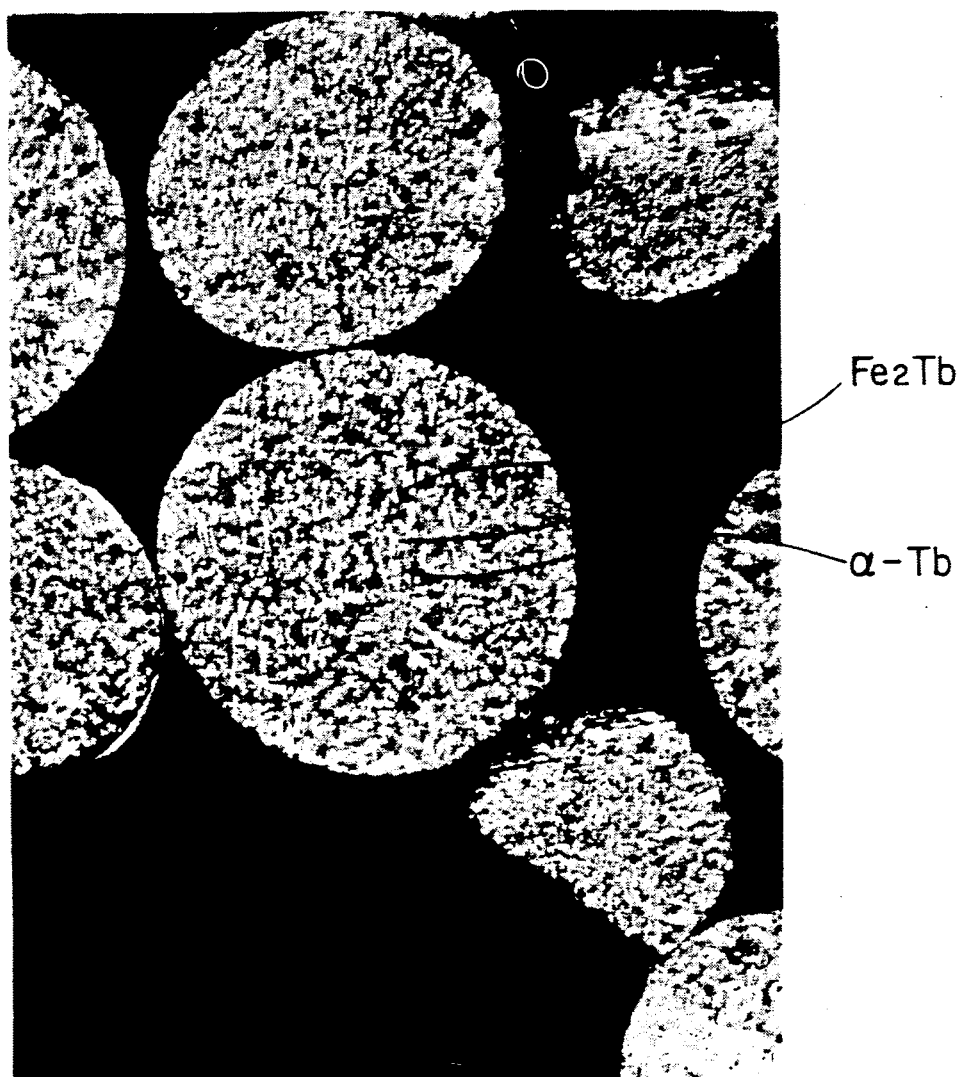
FIG. 3 is a photomicrograph (×400) showing the microstructure of a target alloy powder according to the present invention.

FIG. 3 shows the microstructure of Fe-Tb alloy powder produced by gas atomizing, in which $\alpha$-Tb and Fe$_2$Tb are uniformly and finely precipitated.

Since rare earth metal-iron group metal alloy powder has a significantly greater oxidation resistance than pure rare earth metal powder, the target produced from the above alloy powder has an oxygen content lower by 500–1000 ppm or even more than that produced by sintering a mixture of rare earth metal powder and iron group metal powder.

The starting material powder has desirably an average partial size of 1 mm or less. When the average particle size exceeds 1 mm, unevenness appears in the resulting sintered body, so that the use thereof as a target provides a thin film with a partially uneven composition.

Incidentally, Ti, Al, Cu, Cr, Nb, Ta, Pd or Pt as a corrosion resistance-improving element may be added alone or in the form of an alloy with iron group metal such as Fe-Nb, 50, etc., to the rare earth metal-iron group metal alloy powder and the iron group metal powder produced by a rapid quenching treatment.

After mixing the above starting material powder, pressure sintering is conducted at a temperature lower than a liquid phase-appearing temperature. The reasons for conducting the pressure sintering at a temperature lower than the liquid phase-appearing temperature are that if the pressure sintering temperature is equal to or higher than the liquid phase-appearing temperature, the bonding layer between the iron group metal phase and the rare earth metal-iron group metal eutectic alloy phase grows abnormally, reducing the mechanical strength of the sintered body, and that the $\alpha$-phase of rare earth metal precipitated in the eutectic alloy phase consisting of rare earth metal and iron group metal disappears by reaction with the iron group metal. The preferred pressure sintering temperature is lower than the liquid phase-appearing temperature and higher than or equal to a temperature below the liquid phase appearing temperature by 100° C., and more preferably it is lower than the liquid-phase appearing temperature and higher than or equal to a temperature below the liquid phase-appearing temperature by 30° C. Typical examples of the liquid phase-appearing temperature are 840° C. for Tb-Fe, 695° C. for Tb-Fe-Co, and 630° C. for Tb-Gd-Fe.

As mentioned above, the pressure sintering at temperatures lower than the above liquid phase-appearing temperature can achieve the formation of extremely thin bonding layers, and further it provides the following effects:

(1) It is easy to maintain and control the amounts of an $\alpha$-phase of rare earth metal and an intermetallic compound in alloy powder obtained as starting material powder, and their good dispersion state, (2) the resulting structure has substantially no unevenness, and (3) the oxygen content can be maintained at a low level, thereby contributing to the stabilization of thin film characteristics when sputtering for a long period of time.

The pressure sintering can be conducted by hot isostatic pressing (HIP), hot pressing, hot pack rolling, hot pack forging, etc. As for specific conditions, in the case of hot isostatic pressing, with the conditions of the heating temperature lower than a liquid phase-appearing temperature and higher than or equal to a temperature which is lower than the liquid phase-appearing temperature by 30° C. and an inert gas pressure of 1000–1500 atms. for 2-3 hours, the thickness of the diffusion bonding layer between the iron group metal phase and the rare earth metal-iron group metal eutectic alloy phase can be controlled within 10–30 μm, and the density of the sintered body can be made as high as 97% or more.

In the case of hot pressing to provide a sintered body having a density of 95% or more, it is desirably conducted at a heating temperature lower than the liquid phase-appearing temperature and higher than or equal to a temperature which is lower than liquid phase-appearing temperature by 30° C. and pressing pressure of 150 kg/cm² or more for 2 hours or so.

For hot pack rolling and hot pack forging, the heating temperature may be the same as in HIP, but it is necessary that a rolling or forging reduction in each pass be within 10%.

EXAMPLE 1

Experiments were conducted by using the compositions and sintering conditions as shown in Table 1. In all samples, powder having an average particle size of 0.3 mm or less was used. With respect to the production of powder, the Tb-Fe powder of the present invention (Sample Nos. 1–6) was produced by adding Fe or Tb to a low-oxygen alloy (oxygen content: 130 ppm) having a composition of 70.2 at. % Tb-Fe produced by a fused salt electrolysis method to achieve the desired composition, introducing it into a crucible equipped with a melt discharging nozzle at the bottom thereof, placing the crucible in a gas atomizing apparatus, evacuating the apparatus to a level of $10^{-3}$–$10^{-4}$ Torr, melting the alloy in the crucible by heating by high frequency induction (the starting material powder is completely melted when the temperature reaches about 1200° C.), and then conducting gas atomizing of the alloy by opening the discharging nozzle while applying Ar gas pressure. The Tb-Fe powder produced by the above method contained about 1200 ppm of oxygen on average.

Nd-Dy-Fe powder, Fe powder, Co powder, and Fe-Co powder were also produced by argon gas atomizing like the Tb-Fe powder. An average oxygen content in the resulting powder was 1500 ppm for Nd-Dy-Fe, 250 ppm for Fe, 80 ppm for Co, and 70 ppm for Fe-Co.

Each gas-atomized powder of the above rare earth metal-iron group metal alloy and the iron group metal was mixed in a composition as shown in Table 1, and charged into a V-type mixer, which was evacuated and then filled with an Ar gas to prevent the oxidation of the mixed powder. Mixing of the powder was conducted at a cumulative rotation of 6000 or more to provide as uniform powder mixture as possible.

The mixed powder was then charged into a capsule constituted by a 3 mm-thick mild steel sheet, and the capsule was evacuated to $10^{-4}$ Torr or more, and heated at 400° C. After the capsule was heated at 400° C. for 5 hours, it was sealed. Each capsule was subjected to pressure sintering by using a hot isostatic press (HIP) under the conditions as shown in Table 1.

TABLE 1

| Sample | Mixture Composition (at %) | | | | | Powder Composition | Sintering Conditions | | |
|---|---|---|---|---|---|---|---|---|---|
| No. (1) | Tb | Nd | Dy | Fe | Co | (at %) | Temp. (°C.) | Pressure (atm.) | Time (hour) |
| 1 | 22 | — | — | 68 | 10 | 58Tb—Fe Powder, Fe Powder, Co Powder | 685 | 1200 | 2 |
| 2 | 25 | — | — | 65 | 10 | 58Tb—Fe Powder, Fe Powder, Co Powder | 685 | 1200 | 2 |
| 3 | 28 | — | — | 62 | 10 | 58Tb—Fe Powder, Fe Powder, Co Powder | 685 | 1200 | 2 |
| 4 | 25 | — | — | 65 | 10 | 45Tb—Fe Powder, Fe Powder, Co Powder | 685 | 1200 | 2 |
| 5 | 25 | — | — | 65 | 10 | 85Tb—Fe Powder, Fe Powder, Co Powder | 685 | 1200 | 2 |
| 6 | 25 | — | — | 65 | 10 | 58Tb—Fe Powder, 82.4Fe—Co Powder | 685 | 1200 | 2 |
| 7 | — | 13 | 26 | 46 | 15 | 19Nd—38Dy—Fe Powder, Fe Powder, Co Powder | 560 | 1200 | 2 |
| 8 (2) | 25 | — | — | 65 | 10 | — | — | — | — |
| 9 (3) | 25 | — | — | 65 | 10 | 25Tb—65Fe—10Co | 1100 | 150 | 2 |
| 10 (4) | 25 | — | — | 65 | 10 | Tb Powder, Fe Powder Co Powder | 685 | 150 | 2 |
| 11 (5) | 25 | — | — | 65 | 10 | 38Tb—Fe Powder, Fe Powder, Co Powder | 1250 | 1 | 2 |
| 12 (6) | 25 | — | — | 65 | 10 | Tb Powder, Fe Powder Co Powder | 685 | 150 | 2 |

Note:
(1) Sample Nos. 1–7: Present Invention
Sample Nos. 8–12: Comparative Example
(2) "Nikkei New Material," P. 61, November 24, 1986
(3) Japanese Patent Laid-Open No. 61-91336
(4) Japanese Patent Laid-Open No. 61-99640
(5) Japanese Patent Laid-Open No. 60-230903
(6) Japanese Patent Laid-Open No. 62-70550

After completion of the sintering, and after iron skin was removed from the sintered body by a lathe and a surface grinder, each target of 101 mm in diameter and 3 mm in thickness for evaluating thin film characteristics, each specimen for measuring deflection strength and each sample for analyzing an oxygen content were prepared.

With respect to Comparative Examples, Sample No. 8 is a target produced by vacuum melting and vacuum casting method by using a calcia crucible ("Nikkei New Material", p. 61, Nov. 24, 1986), and Sample Nos. 9–12 are those produced by sintering by a hot press apparatus under the conditions indicated by the references shown in the note of Table 1. Among them, Sample No. 12 was, after pressure sintering, heated at 800° C. for 10 minutes by high frequency induction and then cooled by blowing an Ar gas.

Evaluation of the resulting thin layer was conducted by forming a thin layer of 0.1 μm in thickness on a 7059 glass of 0.15 mm in thickness manufactured by Corning by means of a magnetron-type sputtering apparatus having a high frequency source. The conditions of forming the thin layer were high frequency output of 400 W, and Ar gas pressure of $5 \times 10^{-3}$ Torr, distance of 70 mm between the target and the glass substrate, and during the formation of the thin layer, the glass substrate was not rotated in opposition to the target.

Table 2 shows the oxygen contents and deflection strengths of the targets of the present invention and of Comparative Examples, and the compositions of thin films formed from such targets. Each of the targets of the present invention has an oxygen content of 1100 ppm or less and good deflection strength of 10 kg/cm: or more. The reason for such a good deflection strength appears to be the effect of the iron group metal phase existing in the target.

And with respect to thin film composition, it is only 2 atomic % or less richer in the iron group metal than the target composition, while the targets of Comparative Examples have problems in one or more of the following characteristics: oxygen content, deflection strength and thin film composition.

composition to become stable is as short as within 4 hours. On the other hand, in the case of a target produced by sintering a mixture of pure Tb powder, Fe powder and Co powder (Comparative Example 10), the Tb content decreases by nearly 3 atomic % until it is stabilized, and it took 10 hours or more until the composition became stable. With respect to the targets of Comparative Examples 8, 9 and 11, their thin layer compositions were stable from the initiation of sputtering, but they were poor in Tb by 9 atomic % as compared with the target compositions. In Comparative Example 12, the thin layer composition lacked stability and was poor in Tb by nearly 2-3 atomic % compared to the target composition.

Figure 5:
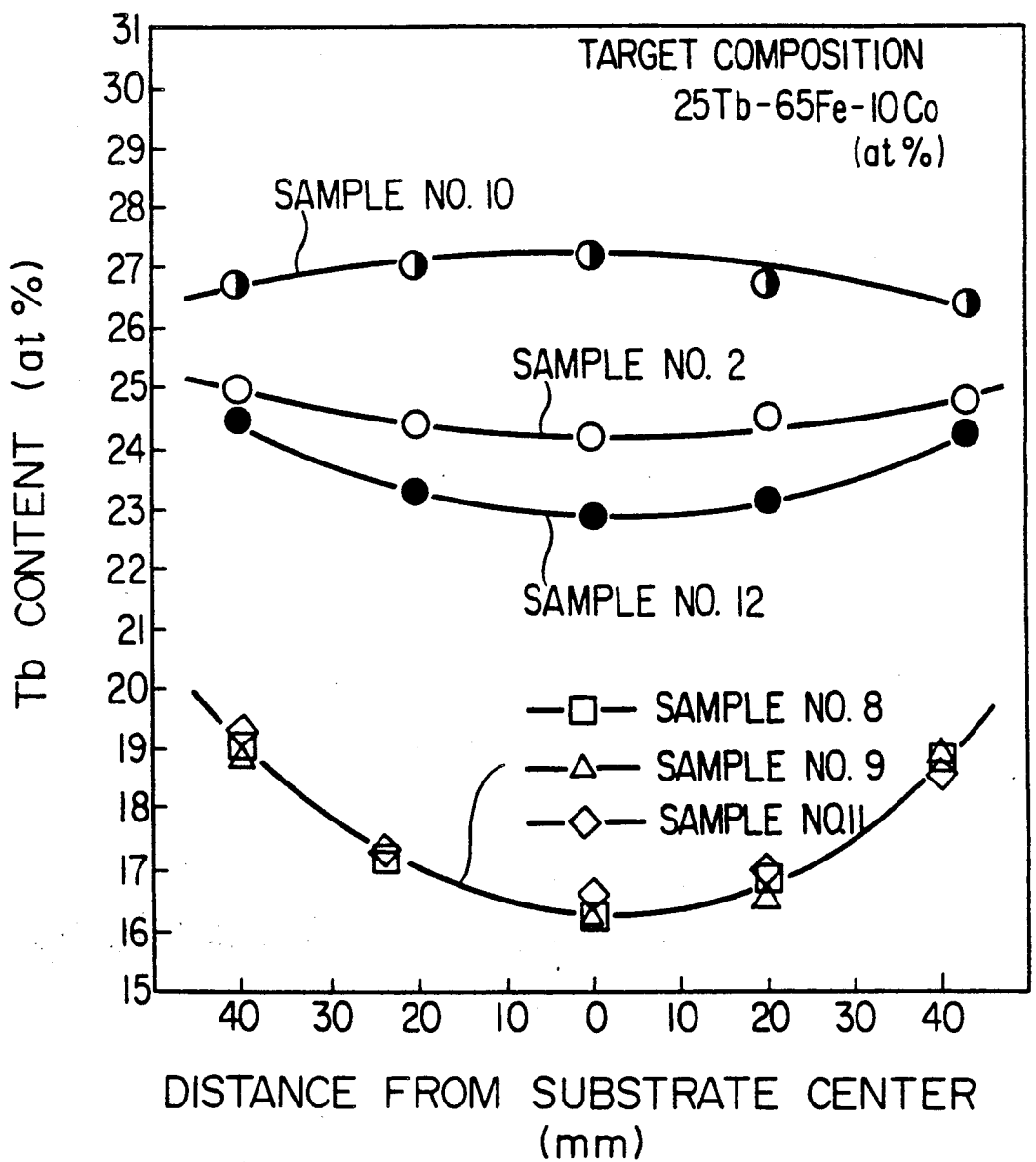
FIG. 5 is a graph showing the distributions of Tb contents in thin layers formed by using various targets.

FIG. 5 shows the distribution of Tb in the plane of the thin layer. In a thin layer formed by using the target of the present invention, its Tb content is −0.8 atomic % at a center and 0-0.2 atomic % at the periphery compared with the target composition, while much larger differences were observed in Comparative Examples.

EXAMPLE 2

Samples having compositions as shown in Table 3 were sintered under conditions as shown in Table 3. In all of the samples, powder of an average particle size of 0.3 mm or less was used to have the desired composition, and mixed uniformly in a V-type mixer to provide

TABLE 2

| Sample No. (1) | Oxygen Content (ppm) | Deflection Strength (Kg/cm²) | Thin Layer Composition (at %) | | | | |
|---|---|---|---|---|---|---|---|
| | | | Tb | Nd | Dy | Fe | Co |
| 1 | 920 | 12 | 21.1 | — | — | 69.6 | 9.3 |
| 2 | 1010 | 10 | 24.2 | — | — | 66.4 | 9.4 |
| 3 | 1090 | 11 | 27.4 | — | — | 63.3 | 9.3 |
| 4 | 890 | 12 | 23.5 | — | — | 67.0 | 9.5 |
| 5 | 1100 | 10 | 24.7 | — | — | 66.0 | 9.3 |
| 6 | 980 | 10 | 24.3 | — | — | 65.8 | 9.9 |
| 7 | 1498 | 21 | — | 12.3 | 24.7 | 48.6 | 14.2 |
| 8 | 300 | 2 | 16.3 | — | — | 73.4 | 10.3 |
| 9 | 580 | 2 | 16.2 | — | — | 73.2 | 10.1 |
| 10 | 1800 | 15 | 27.2 | — | — | 61.8 | 11.0 |
| 11 | 1700 | 6 | 16.3 | — | — | 73.3 | 9.8 |
| 12 | 2100 | 5 | 22.9 | — | — | 67.5 | 9.6 |

Figure 4:
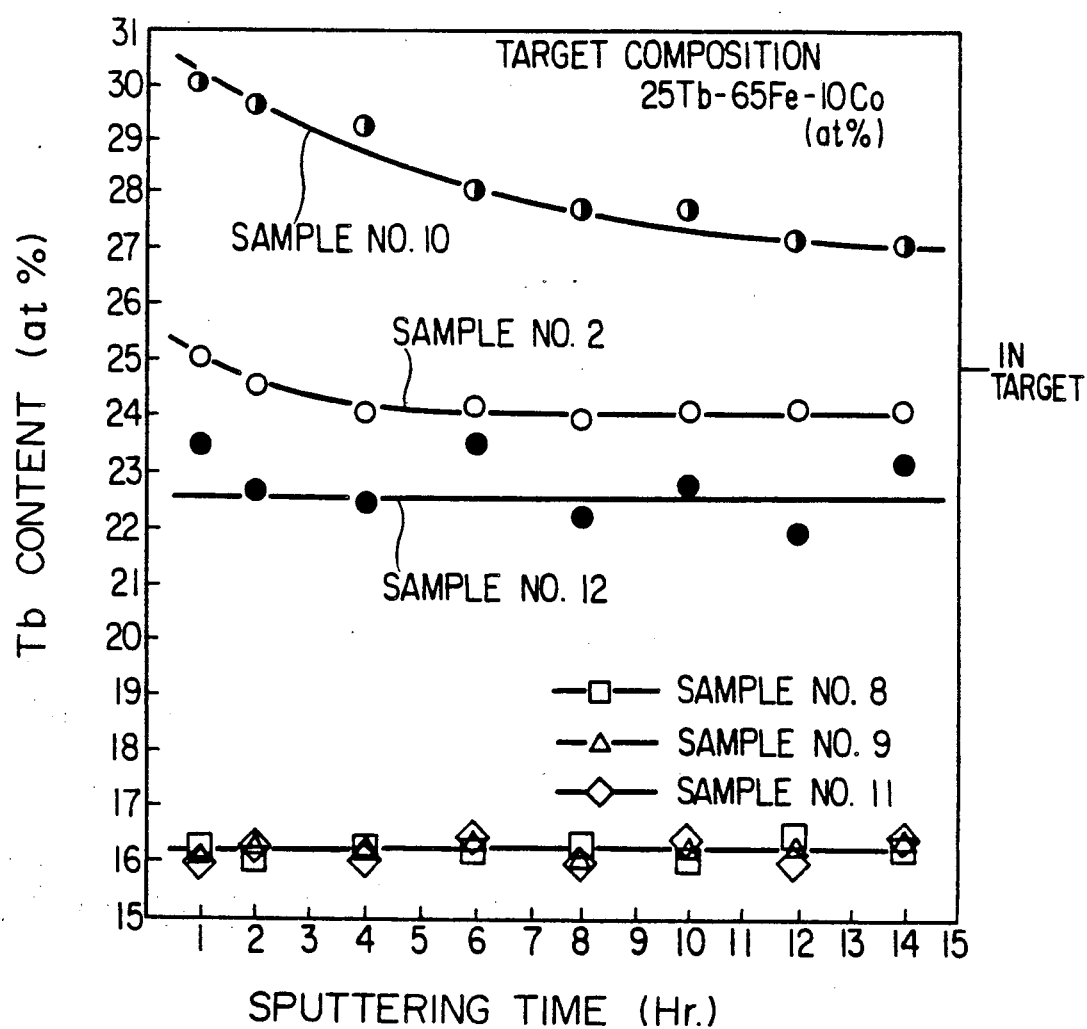
FIG. 4 is a graph showing the relations between Tb contents in thin layers formed by using various targets and sputtering time.

Note:
(1) Sample Nos. 1-7: Present invention
Sample Nos. 8-12: Comparative Example FIG. 4 shows the relations between a thin film composition and sputtering time in the case of forming a thin layer by using the targets of the present invention and those of Comparative Examples. In the case of the target of the present invention (Sample No. 2), only 1 atomic % of change in Tb content occurs until the thin layer composition becomes stable from the initiation of sputtering, and the time necessary for the thin layer mixed powder. The resulting mixed powder was charged into a die of 125 mm in diameter and pressed at room temperature, and sintered by hot pressing in a carbon mold. The production of starting materials per se were conducted in the same manner as in Example 1.

The oxygen content and deflection strength of the resulting targets and the compositions of the thin layers formed from such targets are shown in Table 4.

TABLE 3

| Sample No. (1) | Mixture Composition (at %) | | | | Powder Composition (at %) | Sintering Conditions | | |
|---|---|---|---|---|---|---|---|---|
| | Tb | Dy | Fe | Co | | Temp. (°C.) | Pressure (atm.) | Time (hour) |
| 13 | 28.0 | — | 72.0 | — | 72Tb—28Fe Alloy Powder + Fe Powder | 830 | 150 | 2 |
| 14 | 28.0 | — | 72.0 | — | 82Tb–18Fe Alloy Powder + Fe Powder | 830 | 150 | 2 |
| 15 | 28.0 | — | 72.0 | — | 95Tb—5Fe Alloy Powder + Fe Powder | 830 | 150 | 2 |
| 16 | 28.0 | — | 67.0 | 5.0 | 72Tb—28Fe Alloy Powder + Fe Powder, Co Powder | 685 | 150 | 2 |
| 17 | — | 27.5 | 72.5 | — | 71.5Dy—28.5 Fe Alloy Powder + Fe Powder | 880 | 150 | 2 |
| 18 | — | 27.5 | 72.5 | — | 82Dy—18Fe Alloy Powder + Fe Powder | 880 | 150 | 2 |
| 19 | — | 27.5 | 72.5 | — | 94Dy—6Fe Alloy Powder + Fe Powder | 880 | 150 | 2 |

TABLE 3-continued

| Sample | Mixture Composition (at %) | | | | Powder Composition | Sintering Conditions | | |
|---|---|---|---|---|---|---|---|---|
| No. (1) | Tb | Dy | Fe | Co | (at %) | Temp. (°C.) | Pressure (atm.) | Time (hour) |
| 20 | — | 27.6 | 67.3 | 5.1 | 71.5Dy—28.5Fe Alloy Powder + Fe Powder, Co Powder | 720 | 150 | 2 |
| 21 | 28.0 | — | 72.0 | — | 28.0Tb—72.0Fe Alloy powder | 1100 | 150 | 2 |
| 22 | 28.0 | — | 72.0 | — | Tb Powder + Fe Powder | 830 | 150 | 2 |
| 23 | 28.0 | — | 67.0 | 5.0 | Tb Powder + Fe Powder + Co Powder | 685 | 150 | 2 |
| 24 | — | 27.6 | 67.3 | 5.1 | 27.6Dy—67.3Fe—5.1Co Alloy Powder | 1100 | 150 | 2 |

Note:
(1) Sample Nos. 13-20: Present Invention
Sample Nos. 21-24: Comparative Example

TABLE 4

| Sample No. (1) | Oxygen Content (ppm) | Deflection Strength (Kg/cm²) | Thin Layer Composition (at %) | | | |
|---|---|---|---|---|---|---|
| | | | Tb | Dy | Fe | Co |
| 13 | 980 | 8 | 25.8 | — | 74.2 | — |
| 14 | 1230 | 9 | 27.0 | — | 73.0 | — |
| 15 | 1500 | 10 | 27.4 | — | 72.6 | — |
| 16 | 940 | 9 | 26.3 | — | 68.9 | 4.8 |
| 17 | 1000 | 9 | — | 25.3 | 74.7 | — |
| 18 | 1300 | 10 | — | 26.7 | 73.7 | — |
| 19 | 1470 | 9 | — | 27.0 | 73.0 | — |
| 20 | 990 | 9 | — | 25.9 | 68.8 | 5.3 |
| 21 | 1000 | 2 | 22.3 | — | 77.7 | — |
| 22 | 2000 | 10 | 30.6 | — | 69.4 | — |
| 23 | 2100 | 10 | 30.3 | — | 64.2 | 5.5 |
| 24 | 900 | 2 | — | 22.9 | 72.2 | 4.9 |

Note:
(1) Sample Nos. 13-20: Present invention
Sample Nos. 21-24: Comparative Example All of the targets of the present invention show as small oxygen content as 1500 ppm or less and good deflection strength and were about 2-3% richer in iron group metal than the target compositions. On the other hand, the targets of Comparative Examples had problems in oxygen content, deflection strength and/or thin layer composition.

EXAMPLE 3

With Sample No. 4 (present invention) and Sample No. 12 (Comparative Example) prepared in Example 1, thin layers were formed in the same manner as in Example 1, and their magnetic anisotropy constant Ku (J/m³) was measured by a torque meter.

Figure 6A:
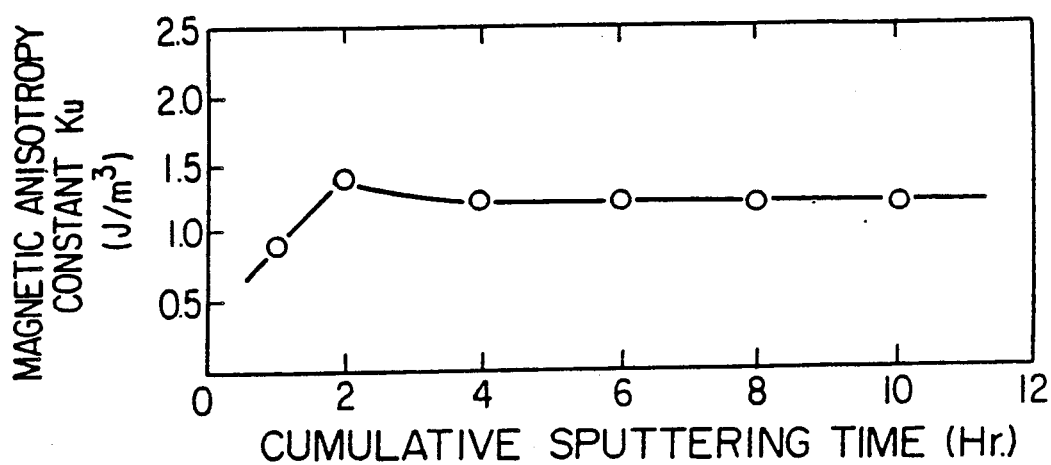
FIGS. 6(a) and (b) are graphs each showing the relation between magnetic anisotropy constant and cumulative sputtering time.
Figure 6B:
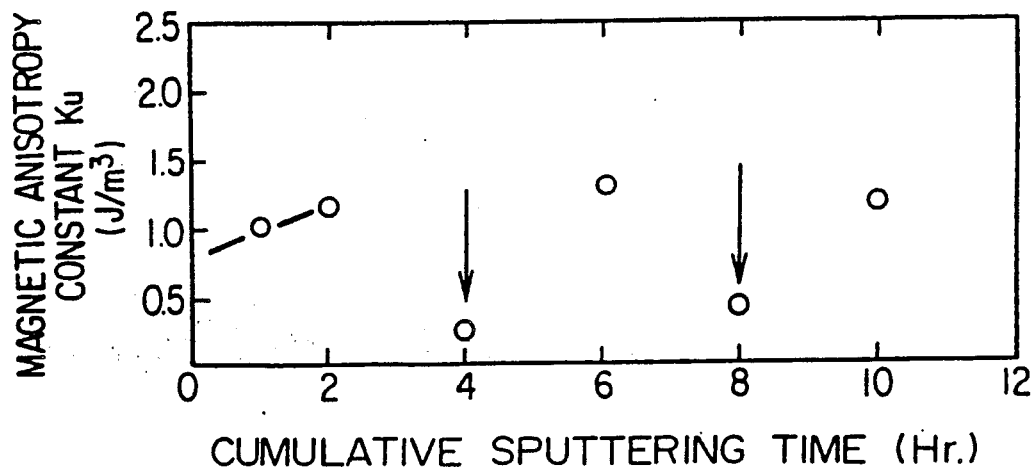

FIG. 6(a) shows the relation between the magnetic anisotropy constant Ku (J/m³) of the thin layer formed by using Sample No. 4 (present invention) and cumulative sputtering time. And FIG. 6(b) shows the relation between the magnetic anisotropy constant Ku (J/m³) of the thin layer formed by using Sample No. 12 (Comparative Example) and cumulative sputtering time.

In the target of the present invention, the magnetic anisotropy constant became stable after the cumulative sputtering time lapsed 4 hours, while in Sample No. 12 having a large oxygen content (Comparative Example) the magnetic anisotropy was unstable, with Ku decreasing substantially, meaning that the resulting thin layer behaves as if it were a horizontally magnetized layer.

EXAMPLE 4

Fe powder, Co powder, Fe-Co powder, Fe-Nb powder, Fe-Co-Nb powder, Fe-Pt powder and Fe-Co-Nb-Pt powder produced by Argon gas atomizing in the same manner as in Example 1 were used in compositions as shown in Table 5 to provide each powder mixture which was then subjected to a HIP treatment at 685° C., 1200 atms. for 2 hours in the same manner as in Example 1 and then sputtered.

The oxygen content and deflection strength of each target and the composition of a thin layer produced from each target are shown in Table 6. Table 6 shows that all of them had a low oxygen content of 1100 ppm or less and a good deflection strength of 10 kg/cm² or more. And with respect to a thin layer composition, the contents of corrosion-resistant elements in the thin layer were substantially the same as in the target compositions.

TABLE 5

| Sample No. | Mixture Composition (at %) | | | | | Powder Composition |
|---|---|---|---|---|---|---|
| | Tb | Fe | Co | Nb | Pt | (at %) |
| 25 | 24 | 63 | 11 | 2 | — | 58.4Tb—Fe, Fe, Co, Nb |
| 26 | 24 | 63 | 11 | 2 | — | 58.4Tb—Fe, Fe—19.33Nb, Nb |
| 27 | 24 | 63 | 11 | 2 | — | 58.4Tb—Fe, Fe—11.66Nb, Fe, Co |
| 28 | 24 | 63 | 11 | 2 | — | 58.4Tb—Fe, Fe—18.68Co—3.4Nb |
| 29 | 24 | 56 | 10 | 2 | 8 | 58.4Tb—Fe, Fe, Co, Nb, Pt |
| 30 | 24 | 56 | 10 | 2 | 8 | 58.4Tb—Fe, Fe—11.66Nb, Fe, Co, Pt |
| 31 | 24 | 56 | 10 | 2 | 8 | 58.4Tb—Fe, Fe—11.66Nb, Fe—10.93Pt, Fe, Co |
| 32 | 24 | 56 | 10 | 2 | 8 | 58.4Tb—Fe, Fe—16.96Co—3.39Nb—13.57Pt |
| 33 | 24 | 63 | 10 | 2Ti | — | 58.4Tb—Fe, Fe, Co, Ti |
| 34 | 24 | 63 | 10 | 2Al | — | 58.4Tb—Fe, Fe, Co, Al |
| 35 | 24 | 63 | 10 | 2Cr | — | 58.4Tb—Fe, Fe, Co, Cr |
| 36 | 24 | 63 | 10 | 2Ta | — | 58.4Tb—Fe, Fe, Co, Ta |
| 37 | 24 | 63 | 10 | 2Pd | — | 58.4Tb—Fe, Fe, Co, Pd |

Note:
All samples: Present invention

TABLE 6

| Sample No. (1) | Oxygen Content (ppm) | Deflection Strength (Kg/cm²) | Thin Layer Composition (at %) | | | | |
|---|---|---|---|---|---|---|---|
| | | | Tb | Fe | Co | Nb | Pt |
| 25 | 1100 | 11 | 23.2 | 63.3 | 11.2 | 2.3 | — |
| 26 | 1030 | 12 | 23.3 | 63.2 | 11.4 | 2.1 | — |
| 27 | 990 | 12 | 23.2 | 63.6 | 11.2 | 2.0 | — |
| 28 | 980 | 10.5 | 23.4 | 63.4 | 11.1 | 2.1 | — |
| 29 | 940 | 11 | 23.4 | 55.6 | 10.4 | 2.2 | 8.4 |
| 30 | 960 | 12 | 23.2 | 56.1 | 10.3 | 2.1 | 8.3 |
| 31 | 910 | 12 | 23.1 | 56.5 | 10.3 | 2.0 | 8.1 |
| 32 | 870 | 12 | 23.3 | 56.5 | 10.1 | 2.0 | 8.1 |
| 33 | 930 | 11 | 23.2 | 63.1 | 11.3 | 2.4 | — |
| 34 | 970 | 12 | 23.2 | 63.3 | 11.2 | 2.3 | — |
| 35 | 960 | 10.5 | 23.3 | 63.4 | 11.3 | 2.0 | — |
| 36 | 980 | 11 | 23.4 | 63.3 | 11.2 | 2.1 | — |
| 37 | 1010 | 12 | 23.5 | 63.2 | 11.1 | 2.2 | — |

Note:
(1) All samples: Present invention

Figure 7:
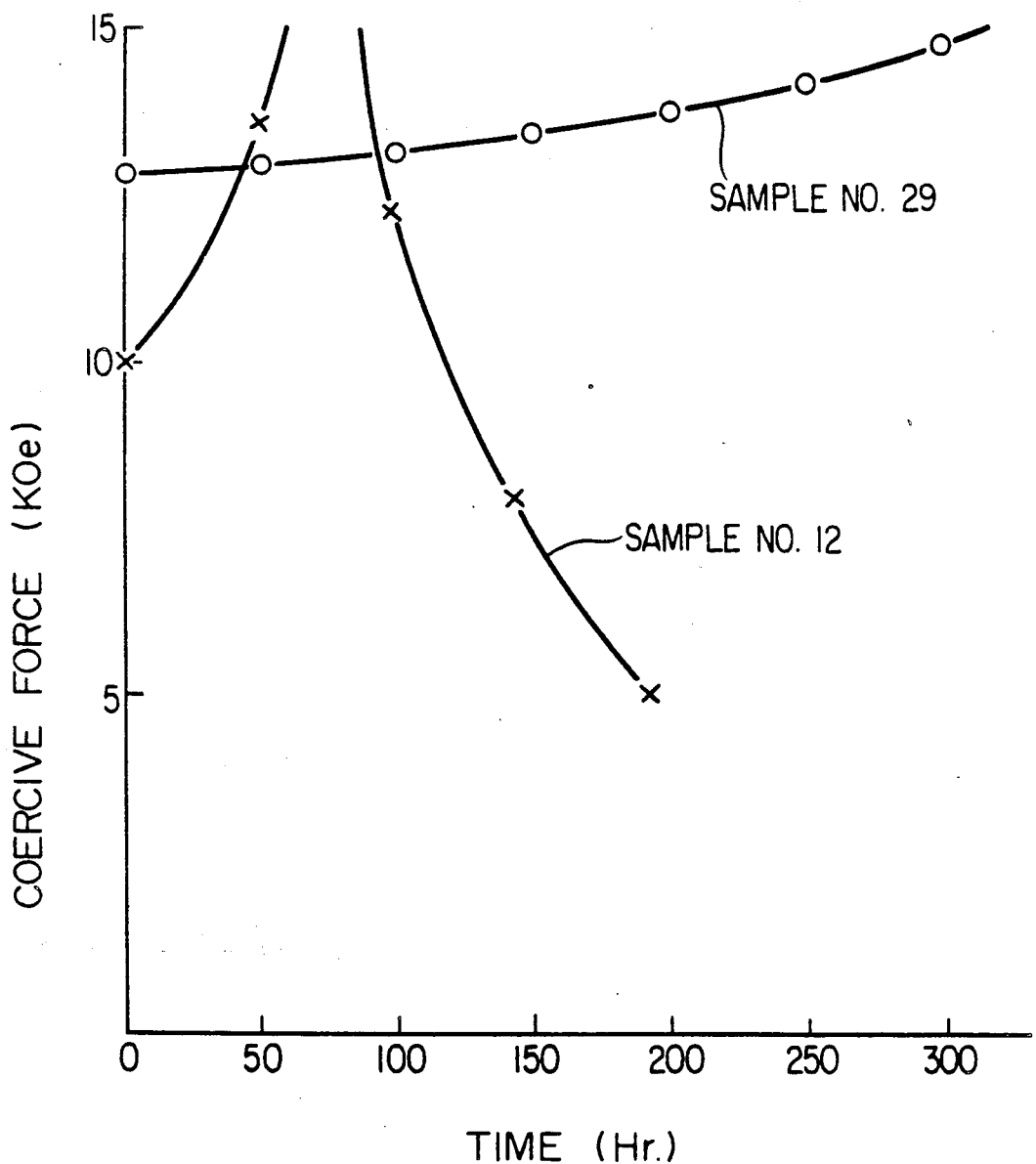
FIG. 7 is a graph showing the variation of coercive force Hc in a corrosion resistance test.

Next, the thin film formed on the glass substrate was evaluated with respect to corrosion resistance. The sample used for evaluation was Sample No. 29 (present invention) and Sample No. 12 (Comparative Example), and the evaluation was carried out by placing the substrate formed with each thin layer in an environment at a temperature of 65° C. and a relative humidity of 95%, and measuring its magnetic properties every 50 hours. The results are shown in FIG. 7.

It is clear from the Table that Sample No. 29 suffered from only a small change in magnetic property (coercive force Hc) over a long period of test time. On the other hand, Sample No. 12 underwent a extreme change in magnetic properties toward the Fe-rich side after the lapse of short time, and after the lapse of 200 hours in test, it lost magnetic characteristics as a vertically magnetized layer.

The above phenomenon appears to be caused by the fact that Tb is preferentially oxidized so that the magnetic characteristics change toward the Fe side, resulting in the complete departure from an amorphous composition.

As explained above in detail, by using as starting material powder a mixture of rare earth metal-iron group metal alloy powder in which an α-phase of rare earth metal and an intermetallic compound phase are finely precipitated and iron group metal alloy powder, and subjecting the resulting mixture to pressure sintering at a temperature lower than a liquid phase-appearing temperature, it is possible to suppress the oxygen content as low as 1500 ppm or less and to minimize the difference in composition between a target used and a thin layer formed, enabling the formation of a thin layer having a stable composition for a long period of sputtering time so that the control of a thin layer composition is easy.

In addition, the target produced by such a method has excellent mechanical workability. Thus, the present invention has high commercial value.

The present invention has been explained in detail referring to the Examples, but it should be noted that any modification can be possible unless it deviates from the scope of the present invention which is defined by the claims attached hereto.

What is claimed is:

1. A method of producing a rare earth metal-iron group metal target for a magneto-optical disk is produced by mixing powder produced by the rapid quenching treatment of an alloy composed of at least one rare earth metal and at least one iron group metal in a composition range which forms an eutectic structure, with at least one iron group metal in an amount necessary for meeting the composition requirements of said target; and subjecting the resulting mixture to pressure sintering in vacuum or in an inert gas atmosphere at a temperature lower than a liquid phase-appearing temperature of said mixture.

2. A method of producing a rare earth metal-iron group metal target comprising the steps of mixing alloy powder composed of ar least one rare earth metal and at least one iron group metal and having a structure in which an α-phase of said rare earth metal an intermetallic compound phase composed of said rare earth metal and said iron group metal are uniformly and finely precipitated, with at least one iron group metal powder in an amount necessary for meeting the composition requirements of said target; and subjecting the resulting mixture to pressure sintering in vacuum in an inert gas atmosphere while retaining the structure of said rare earth metal-iron group metal alloy powder.

3. The method of producing a rare earth metal-iron group metal target according to claim 1, wherein said rare earth metal-iron group metal alloy used as a starting material is an eutectic alloy of at least one rare earth metal and at least one iron group metal produced by a fused salt electrolysis method.

* * * * *

UNITED STATES PATENT AND TRADEMARK OFFICE
CERTIFICATE OF CORRECTION

PATENT NO. : 5,098,649
DATED : March 24, 1992
INVENTOR(S) : Shunichiro Matsumoto et al.

It is certified that error appears in the above-identified patent and that said Letters Patent is hereby corrected as shown below:

Claim 1, column 16, line 35, change ":" to --;--;

Claim 2, column 16, line 41, change "ar" to --at--;

line 43, after "metal" insert --and--.

Signed and Sealed this

Fifteenth Day of June, 1993

Attest:

MICHAEL K. KIRK

*Attesting Officer*     Acting Commissioner of Patents and Trademarks